(12) United States Patent
Jensen et al.

(10) Patent No.: US 7,804,881 B2
(45) Date of Patent: Sep. 28, 2010

(54) LASER SYSTEM WITH SEGMENTED DIODE LASER

(75) Inventors: Ole Bjarlin Jensen, Vaerlose (DK); Birgitte Thestrup Nielsen, Jyllinge (DK); Paul Michael Petersen, Hillerod (DK)

(73) Assignee: Danmarks Tekniske Universitet, Kgs. Lyngby (DK)

( * ) Notice: Subject to any disclaimer, the term of this patent is extended or adjusted under 35 U.S.C. 154(b) by 28 days.

(21) Appl. No.: 12/086,412

(22) PCT Filed: Dec. 5, 2006

(86) PCT No.: PCT/DK2006/000688

§ 371 (c)(1),
(2), (4) Date: Nov. 5, 2008

(87) PCT Pub. No.: WO2007/068245

PCT Pub. Date: Jun. 21, 2007

(65) Prior Publication Data

US 2009/0245305 A1  Oct. 1, 2009

(30) Foreign Application Priority Data

Dec. 16, 2005  (DK) ............................... 2005 01777

(51) Int. Cl.
*H01S 3/081* (2006.01)
(52) U.S. Cl. ............................... 372/93; 372/97; 372/102
(58) Field of Classification Search .................... 372/93, 372/97, 102
See application file for complete search history.

(56) References Cited

U.S. PATENT DOCUMENTS

| 4,995,050 A | 2/1991 | Waarts et al. |
| 5,594,774 A | 1/1997 | Schmidt |
| 6,192,062 B1 | 2/2001 | Sanchez-Rubio et al. |
| 6,212,216 B1 | 4/2001 | Pillai |
| 6,215,595 B1 | 4/2001 | Yamazaki et al. |

(Continued)

FOREIGN PATENT DOCUMENTS

JP  05-206579  8/1993

(Continued)

OTHER PUBLICATIONS

Daneu et al.; "Spectral Beam Combining of a Broad-Strip Diode Laser Array in an External Cavity", vol. 25, No. 6, Optics Letters, Optical Society of America, pp. 405-407, (2000).

(Continued)

*Primary Examiner*—Todd T Van Roy

(57) ABSTRACT

Disclosed is a laser system comprising: A laser assembly (101) comprising a plurality of emitters; first and second light feedback devices (208, 232) forming respective external cavities with the laser assembly; a dispersive device (205) for redirecting respective portions of the light from the laser assembly to the first and second feedback devices (208, 232), wherein the first feedback device (232) is adapted to reflect a feedback portion of the redirected beam back onto the dispersive device (205) and to generate the output beam (233) from an output part of the first redirected beam, —an imaging device (213) for generating an optical Fourier transform of the plurality of emitters at a Fourier plane (235). The dispersive device (205) is positioned displaced from said Fourier plane (235) by a predetermined displacement (d) in a direction along said principle axis (230).

20 Claims, 3 Drawing Sheets

U.S. PATENT DOCUMENTS

2003/0058025 A1  3/2003  Zuffada et al.
2007/0291812 A1* 12/2007 Petersen et al. ............. 372/103

FOREIGN PATENT DOCUMENTS

| JP | 05-206580 | 8/1993 |
|---|---|---|
| WO | 9856087 A1 | 12/1998 |
| WO | 0221651 A1 | 3/2002 |
| WO | WO 02/21651 A1 | 3/2002 |
| WO | WO-0221651 | 3/2002 |
| WO | 02101895 A2 | 12/2002 |
| WO | 03036766 A2 | 5/2003 |
| WO | WO 03/036766 A2 | 5/2003 |
| WO | WO-03036766 | 5/2003 |
| WO | 03084006 A2 | 10/2003 |
| WO | WO 03/084006 A2 | 10/2003 |
| WO | WO-03084006 | 10/2003 |
| WO | 2007068245 A1 | 6/2007 |

OTHER PUBLICATIONS

V. Daneu et al., Optics Letters, vol. 25, No. 6 "Spectral beam combining of a broadstripe diode laser array in an external cavity" (2000).

M. G. Littman et al., "Spectrally narrow pulsed dye laser without beam expander", Applied optics, vol. 17, bo. 14, pp. 2224-2227.

V. Daneu et al., "Spectral beam combining of a broad stripe diode array in an external cavity", Optics Letters, Vo. 25, No. 6, Mar. 15, 2000.

Jensen et al., Stability of the Single-Mode Output of a Laser Diode Array with Phase Conjugate Feedback, Applied Physics Letters, American Institute of Physics, New York, US. Vo. 76, No. 5 (2000), pp. 535-537.

MacCormack et al., "High-Brightness Output from a Laser Diode Array Coupled to a Phase-Conjugating Mirror," Optics Letters, Optical Society of America, vol. 18, No. 3 (1993), pp. 211-213.

M.G. Litman et al., "Spectrally Narrow Pulsed Dye Laser Without Beam Expander," Applied Optics, Vo. 17, bo. 14 (1978), pp. 2224-2227.

* cited by examiner

LASER SYSTEM WITH SEGMENTED DIODE LASER

This invention relates to laser systems and, more particularly, to laser systems comprising segmented diode lasers.

Laser diodes are well known as reasonably priced, small and robust sources of laser beams. Conventional laser diodes with small output power and good coherence properties have been available, and they are used in many applications such as CD players, bar-code readers etc.

More recently, laser diodes with a narrow and broad light emitting area that provide several Watts of output power have become available. These broad-area high-power laser diodes are potentially applicable in industrial areas requiring high power light sources, such as in printing, material processing, medicine, optical sensors and pumping of high-power single mode active waveguides. However, as the optical quality of these lasers is not sufficiently high for many applications, it is generally desirable to improve the optical quality of high-power laser diodes.

In particular, the light beam emitted from such diodes with a broad light emitting stripe is difficult to focus to a small spot size in the direction of the stripe. The direction of the stripe is referred to as the slow axis, while the direction across the stripe is referred to as the fast axis.

Published international application WO 02/21651 discloses a laser system with off-axis feedback that improves the spatial properties of the generated laser beam compared to a freely running diode laser. The term feedback refers to the process where a fraction of the output energy returns to the active region of the laser structure, for example by means of reflection, diffraction, or scattering.

Published international application WO 03/084006 discloses a laser system with two off-axis feedback arms.

The desire to increase the output power of diode laser devices has led to the development of segmented laser sources, such as laser diode bars. Such laser diode bars comprise a number of spatially separated diode lasers that form a plurality of optically independent emitters. The light emitting areas of the individual emitters are arranged side by side on an output facet of the laser diode bar. Typically, each of the light emitting areas is an elongated area having a long dimension along the so-called slow axis and a short dimension along the so-called fast axis substantially perpendicular to the slow axis; both the slow and the fast axis lie substantially in the plane defined by the output facet of the laser source. In a laser diode bar, the individual emitters are typically arranged such that their respective slow axes are aligned with each other lengthwise along the bar, resulting in a large total output area and correspondingly in a large output power.

Unfortunately, the above feedback mechanisms for conventional diode lasers have been found of limited use for segmented diode lasers, because it has proven difficult to provide sufficiently selective feedback for all individual diode arrays.

In standard spectral beam combining, on the other hand, the output from different segments in the laser is combined in a single beam. Each emitter is forced to lase at a wavelength determined by the external cavity in such a way that the various beams overlap. In the Fourier plane the beam from a certain emitter position is incident at a certain angle. The grating diffracts the various wavelengths in the emitter beam into slightly different angles. The beams with wavelengths propagating perpendicular to the output coupler experience feedback and thus each emitter will emit light at one specific wavelength. In standard spectral beam combining the beam quality of the output beam is only as good as the beam quality of the individual segments.

The beam combining effect of a grating and an output coupler on a diode laser array is described as such in "Spectral beam combining of a broad-stripe diode laser array in an external cavity", by V. Daneu et al., Optics Letters, Vol. 25, No. 6, 2000. In this prior art disclosure an arrangement is proposed for combining primary beams from a bar laser by use of a grating positioned between the bar laser and an output coupler consisting of a partially reflecting planar mirror having a 10% reflection coefficient. Thus a external cavity is formed between the output coupler and the bar laser and the reflective grating is positioned to reflect light between the two. A transform lens, situated one focal length away from the diode laser bar focuses the primary beams from the bar laser onto the surface of the grating placed one focal length from the lens, which reflects a commonly aligned beam to strike the output coupler orthogonally. The result is that the primary beams from the bar laser are co-aligned and overlapping into a commonly aligned output beam, with a resulting increase in brightness.

WO 03/036766 suggests a further improvement of the focusing properties of a laser system by combining off-axis feedback and spectral beam combining. In particular this prior art document discloses a laser system that comprises a segmented laser assembly resulting in a primary beam having a twin-lobe far-field distribution. The beam is focused on a grating. From there, one of the two lobes passes through a spatial filter onto an output coupler that reflects a feedback portion of the lobe and transmits an output portion of the lobe as the output of the laser system. The second lobe passes from the grating to a mirror from which it is reflected as feedback.

Even though the above combination of an off-axis feedback with spectral beam combining improves the spatial properties, in particular the spatial coherence, of the output laser beam, the above prior art system is rather bulky, because the different components of the laser system have to be accurately arranged in a particular manner, thus putting lower limits on the minimum achievable size of the system. It is thus a problem to provide a more compact construction of a laser system without significantly reducing the quality of the output beam. Compact laser systems are generally desirable. In particular, in many applications of high-power diode laser systems, such as printing, medical applications and as a pump source for solid state lasers a compact construction is an important design parameter.

The above and other problems are solved by a laser system for generating an output beam, the laser system comprising:

a laser assembly for emitting a primary laser beam, the laser assembly comprising a plurality of emitters for emitting respective primary beam contributions to the emitted primary laser beam;

first and second light feedback devices forming respective external cavities with the laser assembly for reflecting to the laser assembly respective feedback portions of the light produced by the laser assembly;

a dispersive device positioned to receive light from the laser assembly and to redirect respective portions of the received light to the first and second feedback devices as corresponding first and second redirected beams, wherein the first feedback device is adapted to reflect a feedback portion of the first redirected beam back onto the dispersive device and to generate the output beam from an output part of the first redirected beam;

an imaging device for generating an optical Fourier transform of the plurality of emitters at a Fourier plane and to form a combined intensity distribution pattern having multiple lobes positioned off-axis relative to a principal axis of the laser assembly which projects out of an output face thereof;

wherein the dispersive device is positioned displaced from said Fourier plane by a predetermined displacement in a direction along said principle axis.

Consequently, while the effect of spectral beam combining is rather sensitive to an accurate alignment of the dispersive device with the Fourier plane of the imaging device, it has turned out that the quality of the output beam of the above laser system is substantially insensitive to the position of the dispersive device relative to the Fourier plane. Consequently, by moving the dispersive element away from the Fourier plane a more compact design of the laser system can be achieved without impairing the spatial properties of the output beam.

When the dispersive device is displaced from the Fourier plane in a direction towards the imaging device, i.e. when the distance between the dispersive device and the imaging device is reduced, the overall dimension of the laser system in the direction of the principal axis is reduced accordingly. Alternatively, when the dispersive device is moved away from the imaging device, a more narrow/slim configuration can be achieved, since the angle between the principal beam and the redirected beam may be more acute without the redirected beam intersecting with the imaging means.

It is another advantage of the invention that the focal length of the imaging device may be increased without increasing the overall dimension of the laser system significantly. An increase of the focal length causes the spectral sensitivity of the system to increase resulting in a narrower spacing of the frequencies/wavelengths of the individual emitters of the laser assembly. This in turn allows an increase of the number of emitters—and thus the overall output power—in a laser assembly with an amplifying medium of a given bandwidth.

A measure of the quality of a laser beam is the beam quality factor or beam propagation factor $M^2$ as defined in the standard ISO 11146 by the International Organization for Standardization ("Lasers and laser-related Equipment—Test methods for laser beam parameters—Beam widths, divergence angle and beam propagation factor," ISO 11146, Geneva, 1999). A beam having an ideal Gaussian beam profile corresponds to a beam quality factor of $M^2=1$, while $M^2$ becomes larger for beams with a beam profile different from a standard Gaussian beam. The typical $M^2$ values of the low coherence axis of conventional high-power multimode laser diodes range from tens to several hundreds, while the $M^2$ value of the high coherence axis typically is close to one.

Experiments by the inventors have shown the surprising result that the dispersive device may be displaced from the Fourier plane such as to significantly reduce the spectral beam combining effect of the laser system without significantly reducing the spatial properties of the output of the laser system described herein. The dispersive device may thus be displaced such that when the second feedback device is inactivated, e.g. removed from the beam path or blocked, the $M^2$ value of the output beam is considerably increased without significantly affecting the $M^2$ value of the output beam when the second feedback device is activated.

In some embodiments, the displacement is at least 5% of the distance between the imaging device and the Fourier plane, preferably at least 10% of said distance, more preferably at least 20% of said distance, most preferably at least 30% of said distance, e.g. between 40% and 70% of said distance, thereby achieving a considerable reduction of the overall size of the laser system without impairing the spatial properties of the output beam.

In some embodiments, the dispersive device has an entrance surface on which the primary beam impinges, and the displacement is determined as the distance between the respective intersections of the principle axis with said entrance surface and the Fourier plane.

The dispersive device is configured, for a given angle of incidence, to redirect, e.g. to transmit or reflect, light at different angles for different frequencies. In some embodiments, the dispersive device is adapted to direct the first and second redirected beams at an angle relative to the principle axis larger than 50°, preferably larger 70°, more preferably larger than 80°, thereby allowing the dispersive element to be moved closer to the imaging device without the redirected beam from the dispersive device being blocked by the imaging device. Furthermore, a larger angle typically corresponds to a larger spectral sensitivity of the dispersive device, thereby allowing the laser system to be operated with a larger number of emitters, as discussed above.

In some embodiments of the laser system each laser device lases at a different frequency such that its light is directed by the dispersive device along a preferred direction of the first light feedback device to obtain maximum feedback, and the primary beam contributions combine to form at least one combined feedback beam reflected back to the laser assembly and at least one combined output beam leaving the laser system. Each combined beam is formed of component beams derived from the respective emitters and have a common axial direction. The first and second light feedback devices may provide substantially the same or different reflectance to light from the corresponding off-axis lobes of the said combined intensity distribution pattern. When second light feedback device provides a larger reflectance to light from one off-axis lobe of the said combined intensity distribution pattern than the first light feedback device provides to light from another off-axis lobe of the said pattern, a more effective feedback is provided.

The laser assembly comprises a plurality of emitters for emitting respective contributions to the emitted laser beam, such as a diode laser array, a diode laser bar, a segmented diode laser, or the like. In particular, in such a multi-emitter system that generates a plurality of incoherent laser beams, it has turned out that an alignment of the predominant emission directions of the individual emitters with respect to each other considerably improves the efficiency and selectivity of the feedback system, thereby improving the quality of the output beam.

As mentioned above, the emitted laser beam includes respective contributions from the different light emitters of the laser assembly. Correspondingly, the spatial distribution of the emitted laser beam is a combined intensity distribution pattern having multiple lobes. The lobes are positioned off-axis on either side of the optical or principal axis of the laser assembly, which principle axis projects substantially perpendicular out of an output face of the laser assembly. In some embodiments, each individual emitter generates a primary beam contribution having multiple lobes in its far field intensity distribution pattern, such that the lobes of the combined intensity distribution are combined lobes corresponding to the multiple spatial lobes of the individual primary beam contributions.

In one embodiment, the imaging device for generating an optical Fourier transform of the plurality of emitters includes a lens arrangement of one or more lenses—also referred to as Fourier lens(es)—, an imaging mirror, e.g. a concave or convex mirror, or the like. In one embodiment, the imaging device includes a collimating element such as a collimating lens. Generally, the Fourier lens or lens system is positioned in the beam path of the emitted primary laser beam and defines a Fourier plane.

The Fourier plane is thus generally defined as the plane where the Fourier transform of the laser output facet is obtained. This plane can for instance be obtained at a distance of two focal lengths (2f) from the output facet of the laser assembly, if a lens with a focal length f is placed at a distance f from the laser output facet.

In some embodiments, the system further comprises one or more lenses for collimating the fast axis.

In some embodiments, a spatial filter is provided in the external cavity of the second feedback arm formed by the second feedback device, thereby further improving the spatial properties of the laser system. It is believed that this improvement is caused by the fact that the spatial filtering in the second feedback arm has a particularly strong selective effect on the spatial modes, since the second feedback arm provides the strongest feedback compared to the first feedback arm which generates the output beam and, thus, only feeds back a rather small portion of the laser beam.

In some embodiments the first and/or second feedback device include(s) or consist(s) of a non-adaptive reflecting surface, for example a plane mirror, e.g. a dielectric mirror. However other forms of light feedback devices may be used, including a curved mirror, a phase conjugate mirror, or a reflective grating.

In some embodiments, the second feedback device is adapted to feed back one or more predetermined spatial modes of each contribution of the emitted laser beam, thereby improving the spatial properties of the output beam. In a further preferred embodiment, the second feedback device comprises a second reflective member, preferably in combination with the spatial filter for efficiently selecting one or more predetermined modes.

When the second feedback device including said spatial filter is adapted to selectively feed back one or more spatial modes that are present in the freely running laser assembly, the spatial properties of this system are improved. Here the term freely running laser is intended to refer to the laser assembly when operated without any feedback device.

Even though the feedback may be provided to more than one spatial modes it is preferred to substantially feedback a single spatial mode, as such selective feedback results in the largest improvement of the spatial coherence of the output beam.

In a particularly preferred embodiment, the second feedback device comprises a second reflective element including a reflective surface area; and wherein the spatial filter is formed by an edge portion of said reflective surface area proximal to the principle axis. The second reflective element is positioned in the beam path on one side of the principle axis such that the edge portion proximal to the principle axis has a predetermined angular distance from the principle axis. Consequently, only a predetermined angular portion of the emitted beam corresponding to an angle larger than a predetermined lower cut-off angle relative to the principle axis is reflected and fed back into the laser assembly by the second reflective element, while the central beam contributions of the twin-lobe intensity distribution are filtered out. It is an advantage of this arrangement that no additional blocking filter parts for blocking the central beam parts from reaching the mirror are needed, since such additional filter parts may block other parts of the emitted beam, and thus prevent a proper alignment of the laser system. In some embodiments, the spatial filter further blocks the angular beam contributions above a predetermined upper cut-off angle, i.e. the outermost beam portion. The latter is particularly advantageous in combination with a laser assembly with broad emitters.

In one embodiment the reflectivity of the second reflective element is larger than 95%, preferably larger than 98%, most preferably larger than 99%, thereby providing a strong feedback. It is however possible to use lower reflectivities.

Alternatively or additionally, a spatial filter may be placed in the first feedback arm. In a further preferred embodiment, an additional spatial filtering in the first feedback arm may be provided. In particular, in some embodiments, the first feedback device comprises an additional spatial filter adapted to block spatial modes of the first redirected beam which spatial modes correspond to angular contributions having an angle relative to the principle axis that is smaller than a lower cut-off angle, thereby further increasing the efficiency and selectivity of the feedback system.

It has turned out that a particularly high output quality is achieved when the filter is adapted to block at least the innermost portions of the laser beam, i.e. the part that is proximal to the principle axis.

When the first feedback device is adapted to predominantly feed back a respective angular/directional contribution of each of said beam contributions into a corresponding one of the plurality of emitters from which said angular/directional contribution was emitted at a predetermined direction/output angle, the preferred directions of emission of each of the emitters are aligned with respect to each other, even though the contributions from the individual emitters are incoherent with respect to each other. In particular, each emitter is caused to predominantly emit light at an emission angle corresponding to the incident angle of the beam contribution selected by the second feedback device. It has turned out that this alignment considerably improves the efficiency and selectivity of the off-axis feedback in the second feed-back circuit and, thus, the spatial properties of the resulting output beam. Consequently, it is an advantage of the invention that it improves the spatial coherence of the beam at the second feedback device.

Here, the term predominantly feeding back is intended to refer to a selective feedback of a predetermined angular/directional contribution, in particular a preferred/predominant direction of reflection. It is understood, however, that other directional contributions may experience some feedback as well, but to a considerably lesser degree, preferably lesser by a factor of 5 or more.

The combination of the reflective element and the dispersive device in of the first feedback device causes the light emitted from a predetermined region of the light-emitting area, e.g. from one of the emitters of a segmented diode laser, to be predominantly fed back into the same region and substantially at the same angle. Consequently, the preferred directions of emission of the different regions are aligned with respect to each other, thereby improving the efficiency of the feedback in the second feedback device.

In a particularly preferred embodiment, the first feedback device is adapted to reflect at least a part of the first-order contribution of the first redirected beam back onto the dispersive device. As the first-order contribution of the redirected beam shows dispersion, reflecting the first-order contribution provides a wavelength-selective feedback by the first reflective element in cooperation with the dispersive device.

The dispersive device may be implemented as one or more gratings or other diffractive device(s), or any other suitable optical device for generating a spectrally selective redirected beam. Preferably the dispersive device provides at least one diffraction grating, e.g. a reflective grating. Further examples of dispersive devices include a reflective hologram, a transmitting grating, a transmitting hologram, or a dispersive prism, or the like. When the dispersive device is implemented as a single grating the number of components is kept small and a compact setup is achieved. Furthermore, use of a single grating provides a high stability against vibrations, temperature fluctuations etc.

In a further preferred embodiment the dispersive device is adapted to emit more optical power in the first-order contribution of the redirected beam than in the zero-order contribution of the redirected beam, thereby further increasing the efficiency of the feedback and the emitted power of the laser system.

In a yet further preferred embodiment, the first feedback device is adapted to reflect a part of the redirected beam that is emitted from the dispersive device at a predetermined angle, thereby selecting different wavelengths for the different regions of the light-emitting area of the laser assembly, and assuring a co-directional propagation of the beam components from the different regions.

In one embodiment, the first feedback device includes a first reflective element, e.g. a plane reflecting plate. The first reflective element is adapted to reflect a feedback part of the first redirected beam back into the dispersive member and to generate an output beam from an output part of the first redirected beam. Hence, the first reflective element functions as an output coupler.

In another embodiment, the reflectivity of the first reflective element is between about 5-25%, causing between about 75-95% of the light that reaches the first reflective element to be transmitted as an output beam. It has turned out that in some situations, e.g. in case of a particularly precise alignment of the laser system and/or in combination with high gain lasers, the reflectivity of the reflective element may be reduced, e.g. below 10%, thus increasing the output power while maintaining a high beam quality. Accordingly, in one embodiment, the reflectivity of the first reflective element is between about 1-25%, e.g. between 1-5%, between 5-8%, between 5-9%, between 5-10%, or between 5-15% and wherein the first reflective element is adapted to substantially cause the corresponding remaining fraction of the light that reaches the first reflective element to be transmitted as an output beam.

Further preferred embodiments are disclosed in the dependant claims.

The above and other aspects of the invention will be apparent and elucidated from the embodiments described in the following with reference to the drawing in which.

Figure 1A:
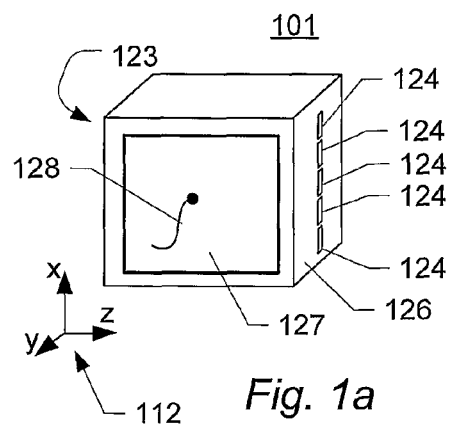
FIG. 1 shows a schematic view of a segmented diode laser.

In the drawings, like reference signs correspond to like or similar components, elements, or the like.

Figure 1B:
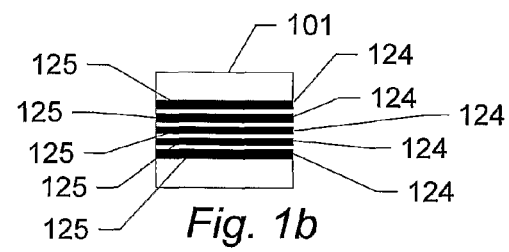

FIG. 1 shows a schematic view of a segmented diode laser. FIG. 1a shows a perspective view of a laser diode and FIG. 1b shows a cross section of a laser diode. Generally, in a segmented laser diode, the emitter stripe is segmented into a number of segments 124, i.e. the emitter stripe comprises a number of regions that are separated by non-emitting areas. For this purpose, the emitter is divided into several subsections 125, e.g. by the introduction of damages into the lasing material or by introducing such periods into the electrodes 127. Hence, the light-emitting facet 126, or so-called front facet, of the laser diode comprises a sequence of several spaced-apart emitters 124 placed next to each other. This results in a light emitting area on the front facet that has considerably larger dimension in the direction of the sequence of emitters (the direction of the x-axis of the coordinate system 112 in FIG. 1) than in the direction orthogonal to the direction of emitters (the direction of the y-axis), i.e. in a broad-area emitter. For example, the total length of the segmented stripe in x-direction may be several hundreds of micrometers, or even up to several millimetres, e.g. 0.5-3 mm, while the width of the stripe in the direction of the y-axis is typically of the order of a few micrometers, e.g. 0.5-5 µm.

Typically, the back facet 123 of the laser diode is coated with a highly reflective coating, while the front facet is coated with a partially reflective coating.

During operation, a drive current is applied to the electrodes 127 via electrical contacts 128. Consequently, such a broad area stripe results in the emission of a large optical power from the diode. However, the emitted spatial properties of the emitted beam quality in the direction of the stripe (x-direction), the so-called slow axis, is considerably lower than in the direction across the stripe (y-direction), the so-called fast axis.

In the direction of the slow-axis the light distribution of each contribution of the emitted beam has a broad structure that is a result of a superposition of a plurality of spatial or transverse modes, where each mode has a twin lobe structure with respective lobes at each side of the optical axis defining a principle axis of the laser diode. Each transverse mode predominantly radiates at a corresponding emission angle resulting in a broad overall light distribution.

Figure 2:
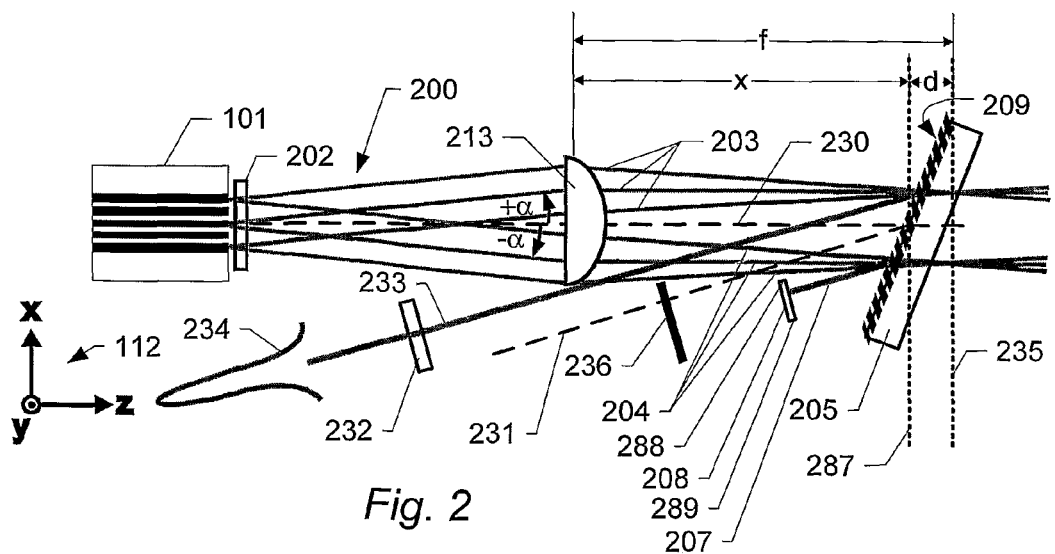
FIG. 2 shows a schematic view of an embodiment of a laser system with an external cavity including an imaging device, a dispersive device, an output coupler and a feedback device, where the dispersive device is positioned displaced from the Fourier plane defined by the imaging device.

FIG. 2 shows a schematic view of an embodiment of a laser system with an external cavity including an imaging device, a dispersive device, an output coupler and a feedback device, where the dispersive device is positioned displaced from the Fourier plane defined by the imaging device. The laser system comprises a segmented, broad-area diode laser 101, e.g. a diode laser as shown in FIG. 1. The laser diode emits a primary laser beam 200 having a slow axis in the plane of the drawing (x-direction) and a fast axis pointing out of the plane of the drawing (y-direction). The laser system further comprises a micro lens 202 attached to the front facet of the diode laser 101. The micro lens collimates the emitted laser beam 200 along the fast axis. The laser system further comprises a lens 213, e.g. a cylinder lens, for collimating/focusing the emitted laser beam 200 along the slow axis. As described above, the laser diode 101 emits a laser beam that has a broad intensity distribution along the slow axis corresponding to a superposition of a plurality of spatial modes from each emitter with twin lobe structures around the optical axis 236. In FIG. 2 this is illustrated by beam paths 203 and 204 representing respective lobes of the twin-lobe distribution emitted from the individual emitters. The cylinder lens 213 is adapted to operate as a Fourier lens defining a Fourier plane as indicated by dotted line 235 at a distance of 2f from the diode laser, where f is the focal length of the cylinder lens 213. The laser system further comprises two optical feedback circuits: A first optical feedback circuit comprises a partially reflecting mirror 232, while a second feedback circuit comprises a reflector 208, e.g. a mirror, providing optical feedback to a part of the laser beam that corresponds to a part of one of the lobes.

The off-axis feedback in one lobe 204 causes predominantly one spatial frequency mode of the multimode beam from each emitter to be selected and to be fed back into the active area of the laser. The feedback causes the other lobe 203 (i.e. the output lobe) of the selected mode to be amplified and all other modes to be effectively suppressed. Consequently, the spatial coherence of each of the segments in the segmented bar is improved using off-axis feedback. Hence, the off-axis feedback is also referred to as off-axis self-injection locking. It is noted that the beam contributions from the individual emitters overlap and may be temporally incoherent with respect to each other. In this embodiment, the off-axis feedback is provided by the mirror 208.

The laser system further comprises a diffraction grating 205 positioned as to receive the collimated primary beam 200 and to diffract the received beam resulting in a diffracted beam having a zero-order component (not shown in FIG. 2) and a first-order component emitted at respective angles from the grating. The principle axis of the first order component emitted in the direction of the partly transmitting mirror 232 and the feedback mirror 208 is illustrated as dashed line 231. The partly transmitting mirror 232 is placed as to reflect the first-order component of at least the diffracted beam corresponding to lobe 203 back onto the grating. Consequently, the grating diffracts the reflected beam back into the laser diode 101. The mirror 232 is partly reflecting and partly transmitting causing a part of the first-order diffracted component 231 to be output from the laser system as an output beam 233. The partly transmitting mirror 232 preferably reflects 10%-25% of the diffracted beam 231 and transmits 90%-75%.

Each of the beams 203 from the respective emitters of the diode laser 101 is incident at a specific angle on the grating 205. The grating 205 diffracts the various wavelengths in the emitter beam into slightly different angles, because the angle at which the first-order diffracted beam is emitted depends on the wavelength and on the incident angle of the beam components. The mirror 232 causes only light at a specific angle and, therefore, a specific wavelength to be coupled back via the grating into the emitter. Consequently, the combination of the grating 205 and the mirror 232 selects different wavelengths for the various emitters and assures co-directional propagation of the individual beams. Furthermore, since the reflected light is again diffracted by the grating 205 into the laser diode, the contributions from each emitter are partially diffracted back into the same emitter. Hence, each emitter emits a beam contribution at an angle $-\alpha$ with respect to the principle/optical axis 230, where the angle is determined by the incident angle $+\alpha$ of the corresponding feedback beam. It is noted that the grating 205 is used in a so-called Littman configuration (see e.g. M. G. Littman et al., "Spectrally narrow pulsed dye laser without beam expander", Applied optics, Vol. 17, Bo. 14, p. 2224-2227).

Preferably, the grating 205 is adapted to emit more optical power in the first-order contribution of the redirected beam than in the zero-order contribution of the redirected beam. For example, the grating may be a surface relief grating, e.g. produced by holographic or direct laser writing in photoresist, where the structure is subsequently transferred to, e.g., a polymer or glass material by a replication process. Other examples of suitable gratings include so-called blazed gratings.

Hence, the first feedback circuit effectively selects a given direction of the emitted beams from all the individual emitter elements in the diode laser, thereby providing an improved spatial filtering in the second off-axis feedback cavity.

The mirror 208 is formed as a narrow mirror stripe, preferably provided with a sharp innermost edge 288, thereby blocking the central part of the intensity distribution, i.e. spatial modes having a small angular distance from the optical/principal axis 230 of the multi-lobe distribution pattern. Preferably, the mirror stripe further includes a peripheral/outermost sharp edge 289, thereby providing a spatial filter effect both in the innermost part and in the outermost part of the beam path 307 without blocking other parts of the laser beams. The term innermost is intended to refer to the part of the laser beam proximal to the principle/optical axis 231 of the first-order diffracted beam, and the term outermost is intended to relate to the part of the beam distal to the optical axis 231. Hence, the mirror stripe 208 provides a spatial filtering of the laser beam that is fed back and, thus, allowing a more efficient selection of one or more individual spatial modes of the multi-mode structure. Spatial filtering of the emitted laser beams in the second feedback arm is advantageous, since the strongest feedback (close to 100%) is obtained in this arm. Especially, it is desirable to have a spatial filter effect in the innermost part of the beam path 207 in order to suppress unwanted feedback effects from spatial frequency modes in the central part of the first order diffracted beams.

In order to achieve efficient off-axis feedback from the second feedback circuit, it is desirable that the mirror 208 has a high reflectivity close to 100%.

The laser system further comprises a filter 236 placed in the beam path of the diffracted beam as to block the centre part of the first-order diffracted beam. It has turned out that spatial filtering in the first feedback arm is less important, since this arm has a significant weaker feedback effect (10%-25%). However, in addition to spatial filtering in the second feedback arm, spatial filtering in the first feedback arm improves to some extent the beam quality of the output beam even further. Such a filtering effect is obtained, e.g., by the filter 236 that blocks, predominantly, mode lobes from spatial frequency modes in the central part of the first order diffracted beams. It is also possible to apply the laser system with an additional spatial filtering of the outermost part of the diffracted beam 231. This can have a minor effect on the beam quality of the output beam (<5% improvement). However, in practice it can be difficult to apply the laser system with such a filter without blocking part of the output beam. Preferably, the filter 236 is placed after, i.e. downstream from, the mirror 208. The filter 236 assures that only light from one lobe 203 reaches the mirror 232, thereby improving the selectivity of the feedback.

The underlying mechanism of the laser system described herein is believed to be off-axis self-injection locking of the individual segments in the diode laser along the slow axis combined with wavelength multiplexing.

Generally, in off-axis self-injection locking of broad area diode lasers one spatial lobe is selected and fed back into the diode laser. Thereby the other spatial lobe is amplified and other spatial modes are suppressed. In the laser system described herein, off-axis self-injection locking is provided for each emitter individually. This is achieved by placing a mirror in the first order diffracted beam from the grating.

According to embodiments of the present invention, the grating and the output coupler are used in an off-axis configuration where they are adapted to feed back a part of the laser beam only. Due to the combination of the off-axis feedback and the direction-selective feedback, the output beam 233 has a narrow spatial distribution that can be focused to a small spot size, as illustrated by the curve 234. It is noted that the laser system described herein leads to a spatial coherence of the overall output beam that is even better than the spatial coherence of the individual elements in the segmented diode, in contrast to the method suggested by Daneu et al (ibid) where the overall improvement cannot be better than the spatial coherence of each element.

In contrast to standard spectral beam combining, the grating 205 is positioned displaced from the Fourier plane 235. In particular, in this embodiment, the grating is displaced from the Fourier plane 235 along the principal axis 230 and in the direction towards the lens 213. Hence, in this embodiment, the distance x between the lens 213 and the grating 205 is smaller than the focal length f of the lens 213. Generally, the displacement of the grating or other dispersive device is conveniently determined as the distance d between the respective intersections of the principle axis 230 with an active/diffracting surface 209 of the dispersive device and with the Fourier plane 235.

Furthermore, the axial position of the feedback mirror, the axial position of the additional spatial filter and the axial position of the output coupler have not significantly influenced the quality of the output beam.

Figure 3:
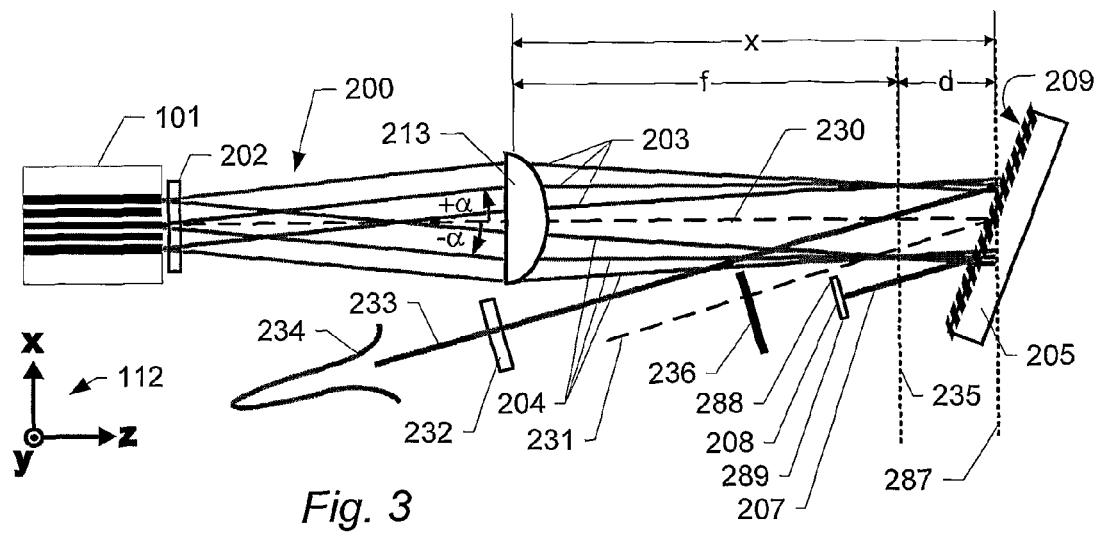
FIG. 3 shows a schematic view of an embodiment of a laser system with an external cavity including an imaging device, a dispersive device, an output coupler and a feedback device, where the dispersive device is positioned displaced from the Fourier plane defined by the imaging device.

FIG. 3 shows a schematic view of another embodiment of a laser system with an external cavity including an imaging device, a dispersive device, an output coupler and a feedback device, where the dispersive device is positioned displaced from the Fourier plane defined by the imaging device. The laser system of FIG. 3 includes the same components as the embodiment described in connection with FIG. 2, and the components are positioned in the same general manner, except that in this embodiment the grating 205 is displaced from the Fourier plane 235 along the principal axis 230 and in the direction away from the lens 213. Hence, in this embodiment, the distance x between the lens 213 and the grating 205 is larger than the focal length f of the lens 213. As can be seen from FIG. 3, a larger distance x allows the angle between the principle axis 230 of the primary emitted beam 200 and the principle axis 231 of the diffracted beam to be smaller without the diffracted beam 233 being blocked by the lens 213, thereby allowing for a slimmer general setup. The angle between the principle axes 230 and 231 is determined by the orientation and type of the grating 205.

Generally, the larger the displacement of the grating from the Fourier plane, the more compact the laser system can be made, e.g. by shortening the system along the principle axis when the grating is displaced towards the lens, or by providing a slimmer setup when the grating is displaced away from the lens 213. To provide at noticeable effect on the size of the laser system, it is preferred that the displacement is larger than the size of the projection of the active surface area of the grating onto the principle axis 230. Here the term active surface area refers to the part of the surface 209 that is illuminated by the beam 200.

The effect of the positioning of the dispersive device with respect to the Fourier plane will now be illustrated by means of an example. In this example, a laser system as shown in FIGS. 2 and 3 is used with a diode laser 101 operating at 808 nm and with a maximum output power of 5 W. The diode laser 101 was abroad-area laser with an active volume of 500 µm×1 µmm×1 mm (width×height×length), divided into 5 spaced apart emitters/active segments. A cylindrical micro lens 202 was attached to the front facet of the laser for collimating the fast axis of the laser beam. The external cavity included a cylindrical lens 213, a diffraction grating 205, an output coupler 232, a mirror 208, and a spatial filter 236. The lens 213 had a focal length of f=80 mm and was positioned as to collimate the emitted beam along the slow axis. The grating 205 was a gold coated grating with a reciprocal fringe spacing of 1200 fringes/mm and with 86% diffraction efficiency. The output coupler 232 was a partially reflecting plane mirror with 18% reflectivity. The mirror 208 was a gold coated mirror placed in the first order diffracted beam. The spatial filter 236 was placed behind the gold coated mirror 208.

This general setup was used to measure the beam quality factor $M^2$ as well as beam profiles of the output beam for different configurations as will now be explained with reference to FIGS. 4 and 5.

Figure 4:
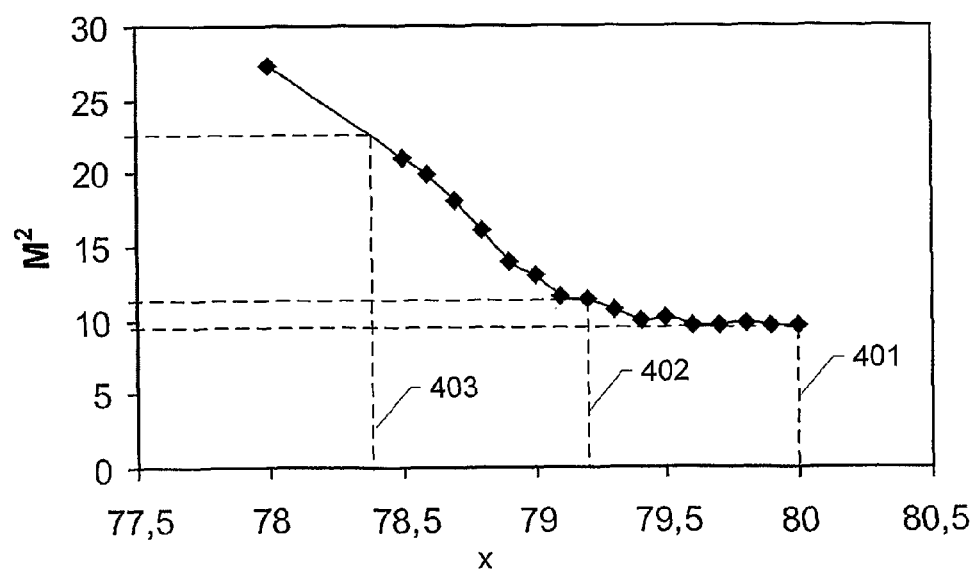
FIG. 4 shows measured $M^2$ values vs. the grating lens distance for spectral beam combining with an f=80 mm lens.

FIG. 4 shows measured $M^2$ values vs. the grating-lens distance for spectral beam combining with an f=80 mm lens. Using the laser system of the above example, but with the feedback mirror 208 and the spatial filter 236 removed from the system, the quality parameter $M^2$ was measured for a number of different distances x (in mm) between the grating 205 and the lens 213. Since the focal length of the lens in this example was f=80 mm, the distance x=80 mm (indicated by reference numeral 401) corresponds to a standard spectral beam combining configuration, i.e. without an off-axis self-injection feedback, since the mirror 208 and filter 236 were removed for this measurement, and with the grating 205 positioned in the Fourier plane 235. FIG. 4 further shows the results for a number of $M^2$ measurements with the grating 205 displaced towards the lens corresponding to distances x in the interval between 78 mm and 79.9 mm.

The beam quality parameter was determined from beam profiles measured by means of a beam analyzer along a focus of the slow axis. To this end the output beam was focused in the slow axis with a cylindrical lens (f=60 mm). The $M^2$ value was determined by measuring the FWHM beam diameter $D_e(z)$ at $1/e^2$ intensity versus the distance z from an arbitrary reference plane, when moving the beam analyzer through the focus point over a distance in the order of a Rayleigh range. To obtain values of $M^2$, the measured beam diameters along the focus are fitted with the following equation for obtaining the $M^2$ value:

$$D_e(z)=(D_0^2+(4M^2\lambda/(\pi D_0))^2\cdot(z-z_0)^2)^{1/2},$$

where $D_0$ is the beam waist diameter at $1/e^2$ level, $\lambda$ is the wavelength of the laser, and $z_0$ is the beam waist position.

As can be seen from FIG. 4, the beam quality in spectral beam combining is rather sensitive against displacements of the grating from the Fourier plane. Even a displacement by 1% of the focal length, i.e. to x=79.2 mm as indicated by reference numeral 402, results in a noticeable increase of $M^2$ of about 10% of the minimum $M^2$ value at x=80 mm. A displacement by about 2% (as indicated by reference numeral 403) results in an increase of $M^2$ by a factor of about 3. Hence, when the displacement is at least 2-5% of the focal length, the effect of the spectral beam combining in terms of an improvement of $M^2$ is considerably reduced.

However, as described herein, when the second feedback mirror 208 is inserted in the diffracted beam 207, the sensitivity against displacements of the grating essentially disappears.

In general, in some embodiments it has turned out that the dispersive device may be displaced as to increase a measured $M^2$ value of the output beam in the laser system compared to a corresponding smallest $M^2$ value measured when the dispersive device is placed substantially in the Fourier plane by at least a factor of 2, preferably at least a factor of 3, more preferably at least a factor of 4; wherein said $M^2$ values are measured with the second feedback device being inactivated/removed. Such displacements did not noticeably reduce the beam quality of the output beam.

The observed insensitivity against displacements of the grating is illustrated by the results summarized in table 1 below:

TABLE 1

$M^2$ data obtained for different configurations.

| Configuration | Output power [mW] | x: lens-grating distance [mm] | $M^2$ |
|---|---|---|---|
| 1 | 786 | NA | 55 |
| 2 | 745 | 80 | 9 |
| 3 | 670 | 80 | 7.7 |
|   | 560 | 80 | 5.3 |
| 4 | 560 | 80 | 2.4 |
|   | 540 | 80 | 2.18 |
|   | 530 | 80 | 2.08 |
|   | 510 | 80 | 1.9 |
| 5 | 770 | 63 | 44 |
|   | 765 | 60 | 31 |
| 6 | 560 | 73.5 | 2.4 |
|   | 550 | 73.5 | 2.35 |
|   | 520 | 73.5 | 2 |
|   | 510 | 73.5 | 1.9 |
|   | 560 | 63 | 2.5 |
|   | 510 | 63 | 2 |
|   | 560 | 60 | 2.35 |
|   | 535 | 60 | 2.05 |
| 7 | 760 | 105 | 39 |
| 8 | 550 | 105 | 2.5 |
|   | 520 | 105 | 2.3 |

All data are obtained at a drive current of 2.2 A.

Table 1 shows $M^2$ values obtained for different configurations (enumerated configuration 1 through 8, see below) of the laser system of the above example, for different output powers of the laser diode, and for different distances x between the grating and the lens. The column headed "Output power" corresponds to the output power in the first-order diffracted beam 233. In configuration 1 the output power is measured immediately behind the lens that collimates the fast axis of the laser diode.

In particular, measurements have been performed on the laser in the following configurations:

| | |
|---|---|
| Configuration 1: | Freely running (FR), i.e. the laser diode without any feedback, |
| Configuration 2: | The laser with spectral beam combining (SBC) optimized for low $M^2$ with the grating 205 placed in the Fourier plane 235. The mirror 208 and the spatial filter 236 removed from the system. |
| Configuration 3: | The laser with optimized SBC and spatial filtering, i.e. with spatial filters inserted on both sides of the first order diffracted beam. |
| Configuration 4: | The laser with optimized SBC and mirror feedback, i.e. with mirror 208 and the spatial filter 236 inserted. |
| Configuration 5: | The laser with SBC, and with the grating 205 placed before the Fourier plane 235, i.e. displaced towards the lens 213 as shown in FIG. 2. |
| Configuration 6: | The laser with SBC with the grating 205 placed before the Fourier plane 235 and with mirror feedback, i.e. with mirror 208 and the spatial filter 236 as shown in FIG. 2. |
| Configuration 7: | The laser with SBC with the grating 205 placed after the Fourier plane 235. |
| Configuration 8: | The laser with SBC with the grating 205 placed after the Fourier plane 235 and mirror feedback from mirror 208 and the spatial filter 236, as shown in FIG. 3. |

As can be observed from the results listed in table 1, over a wide range of displacements the beam quality parameter and output power is rather insensitive to the distance from the collimating lens 213 to the diffraction grating 205 (as can e.g. be seen from a comparison of the results for configuration 4 with configurations 6 and 8, respectively). The differences are within the uncertainty limit of the measurements. Even for displacements larger than 20-30% of the focal length, no significant reduction of the beam quality has been observed.

A comparison of configuration 2 with configurations 5 and 6, respectively, illustrates the same results as was shown in FIG. 4, i.e. the strong sensitivity of the spectral beam combining alone on the position of the grating.

Furthermore, table 1 shows that the laser system with off-axis feedback and the direction-sensitive feedback from the grating and mirror combination considerably reduces the $M^2$ as compared to a system with spectral beam combining alone (as can e.g. be seen from a comparison of the results for configurations 2 and 4).

FIG. 5 shows different beam intensity profiles along the slow axis of the focused output beam at I=2.2 A. To this end, a beam analyzer was placed in the output beam path of different configurations of the laser system of the above example. The intensity distribution curves shown in FIG. 5 illustrate the beam intensity in arbitrary units as a function of the radial displacement (in μm) from an arbitrary reference point.

Figure 5A:
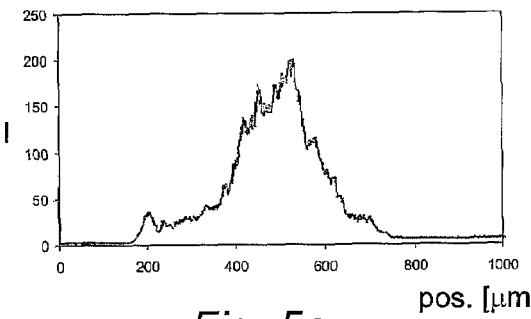
FIG. 5 shows different beam profiles of the focused output beam at I=2.2 A.
Figure 5B:
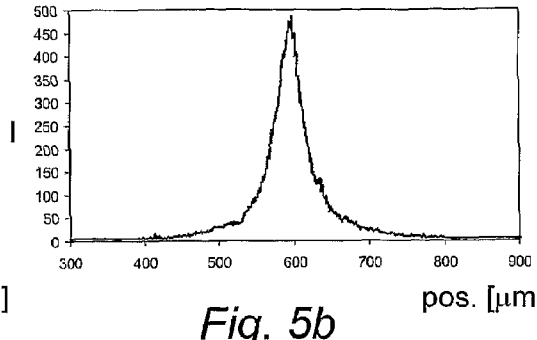
Figure 5C:
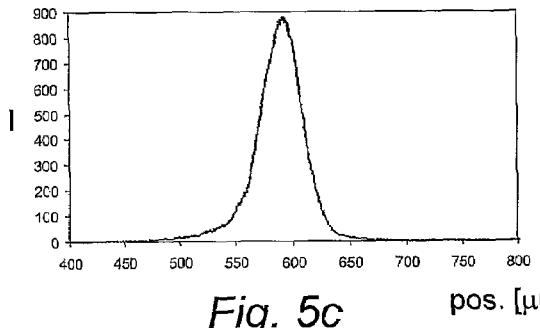
Figure 5D:
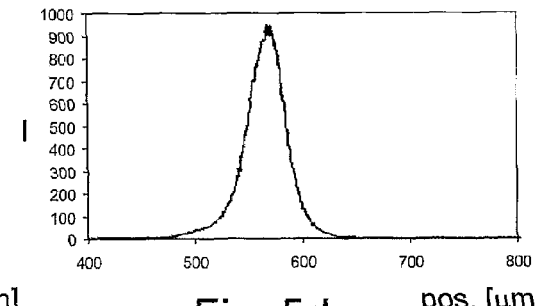

FIG. 5*a* shows the beam profile of the freely running laser corresponding to "configuration 1" above. FIG. 5*b* shows the beam profile of the laser with optimized spectral beam combining ($M^2$=9), corresponding to "configuration 2" above. FIG. 5*c* shows the beam profile of the laser with optimized spectral beam combining and mirror feedback ($M^2$=2.4), corresponding to "configuration 4" above. Finally, FIG. 5*d* shows the beam profile of the laser with the grating placed before the Fourier plane (x=60 mm) and mirror feedback ($M^2$=2.35), corresponding to "configuration 6" above.

A comparison of FIGS. 5*a-d* shows that the beam profiles of FIGS. 5*c* and *d* are almost identical, i.e. even a large displacement of the grating in a system with additional self-injection off-axis feedback does not significantly reduce the output beam quality.

Figure 6:
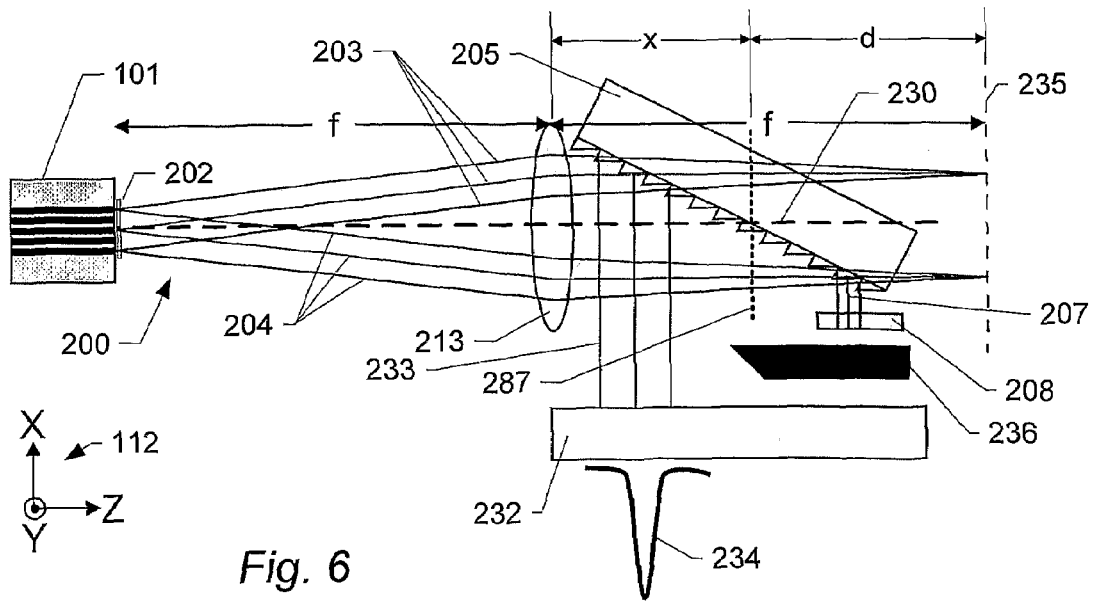
FIG. 6 shows a schematic view of yet another embodiment of a laser system with an external cavity including an imaging device, a dispersive device, an output coupler and a feedback device, where the dispersive device is positioned displaced from the Fourier plane defined by the imaging device.

FIG. 6 shows a schematic view of yet another embodiment of a laser system with an external cavity including an imaging device, a dispersive device, an output coupler and a feedback device, where the dispersive device is positioned displaced from the Fourier plane defined by the imaging device. The laser system of FIG. 6 includes the same components as the embodiment described in connection with FIG. 2, and the components are positioned in the same general manner, except that in this embodiment the grating 205 is displaced even further away from the Fourier plane 235 along the principal axis 230 and in the direction towards the lens 213. In this embodiment, the displacement d is larger than 50% of the focal length f. Furthermore, in this embodiment, the grating 205 is oriented at a larger angle relative to a plane 287 perpendicular to the optical axis 230 as compared to the embodiment of FIG. 2. Consequently, the 1-st order diffracted beam 233 is directed at an angle close to 90° relative to the optical axis towards the output coupler 232 and the mirror 208, thereby avoiding that the diffracted beam is blocked by the lens 213 or other components of the system.

The embodiment of FIG. 5 thus provides a particularly compact setup, where the grating may be moved as close to the lens 213 as is geometrically possible i.e. until the grating actually would touch the lens. This embodiment further provides a particularly high wavelength selectivity as described above.

Although preferred embodiments of the present invention have been described and shown, the invention is not restricted to them, but may also be embodied in other ways within the scope of the subject matter defined in the following claims.

In particular, in the above embodiments, the spatial filter and the reflector of the second feedback device are integrated in a single element, namely as a narrow mirror stripe. However, it is understood that the off-axis feedback system may be implemented in a number of ways. For example, an integrated mirror and filter device may be provided by coating a part of a mirror, or the like. The mirror or the mirror stripe may be plane, curved, or the like. Alternatively or additionally, spatial filtering may be performed by placing an additional spatial filter in the beam path, e.g. an aperture, a slit, or the like. Such a spatial filter may be placed in front of the grating and/or between the grating and the feedback mirror.

In summary, disclosed herein is a laser system comprising: A laser assembly comprising a plurality of emitters; first and second light feedback devices forming respective external cavities with the laser assembly; a dispersive device for redirecting respective portions of the light from the laser assembly to the first and second feedback devices, wherein the first feedback device is adapted to reflect a feedback portion of the redirected beam back onto the dispersive device and to generate the output beam from an output part of the first redirected beam; an imaging device for generating an optical Fourier transform of the plurality of emitters at a Fourier plane. The dispersive device is positioned displaced from said Fourier plane by a predetermined displacement in a direction along said principle axis.

The present invention may advantageously be applied in a variety of applications including the graphic industry, marking and engraving applications, dentistry, as a pump source for telecommunication lasers, wavelength multiplexing in optical communication systems, as a pump source for solid state lasers, material processing such as plastic welding and soldering, medical applications where coupling into thin core optical fibres is needed, etc.

In the device claims enumerating several means, several of these means can be embodied by one and the same item of hardware. The mere fact that certain measures are recited in mutually different dependent claims or described in different embodiments does not indicate that a combination of these measures cannot be used to advantage.

It should be emphasized that the term "comprises/comprising" when used in this specification is taken to specify the presence of stated features, integers, steps or components but does not preclude the presence or addition of one or more other features, integers, steps, components or groups thereof.

The invention claimed is:

1. A laser system for generating an output beam, the laser system comprising:
    a laser assembly for emitting a primary laser beam, the laser assembly comprising a plurality of emitters for emitting respective primary beam contributions to the emitted primary laser beam;
    first and second light feedback devices forming respective external cavities with the laser assembly for reflecting to the laser assembly respective feedback portions of the light produced by the laser assembly;
    a dispersive device positioned to receive light from the laser assembly and to redirect respective portions of the received light to the first and second feedback devices as corresponding first and second redirected beams, wherein the first feedback device is adapted to reflect a feedback portion of the first redirected beam back onto the dispersive device and to generate the output beam from an output part of the first redirected beam;
    an imaging device for generating an optical Fourier transform of the plurality of emitters at a Fourier plane and to form a combined intensity distribution pattern having multiple lobes positioned off-axis relative to a principal axis of the laser assembly which projects out of an output face thereof;
    wherein the dispersive device is positioned displaced from said Fourier plane by a predetermined displacement in a direction along said principle axis; the displacement being defined as a distance between respective intersections of the principle axis with an entrance surface of the dispersive device and with the Fourier plane.

2. A laser system according to claim 1, wherein the dispersive device is displaced as to reduce the spectral beam combining effect of the laser system.

3. A laser system according to claim 1 or 2, wherein the displacement is at least 5% of the distance between the imaging device and the Fourier plane.

4. A laser system according to claim 1, wherein the dispersive device is displaced from the Fourier plane in a direction towards the imaging device.

5. A laser system according to claim 1, wherein the dispersive device is adapted to direct the first and second redirected beams at an angle relative to the principle axis larger than 50°.

6. A laser system according to claim 1, wherein the dispersive device is displaced as to increase a measured value of a beam propagation factor $M^2$ of the output beam in the laser system compared to a corresponding smallest $M^2$ value measured when the dispersive device is placed substantially in the Fourier plane by at least a factor of 2, 3, or 4; wherein said $M^2$ values are measured with the second feedback device being inactivated.

7. A laser system according to claim 1, wherein the first feedback device is adapted to predominantly feed back a respective angular/directional contribution of each of said primary beam contributions to a corresponding one of the plurality of emitters from which said angular/directional contribution was emitted at a predetermined output angle, to cause each of the plurality of emitters to predominantly emit a beam contribution towards the second feedback device at an angle corresponding to the predetermined output angle.

8. A laser system according to claim 1, wherein the first feedback device is adapted to reflect at least a part of a first-order contribution of the first redirected beam back onto the dispersive device.

9. A laser system according to claim 1, wherein the dispersive device is adapted to emit more optical power in the first-order contribution of the first redirected beam than in a zero-order contribution of the first redirected beam.

10. A laser system according to claim 1, wherein the first feedback device is adapted to reflect a part of the first redirected beam that is emitted from the dispersive device at a predetermined angle.

11. A laser system according to claim 1, wherein the first feedback device includes a first reflective element having a reflectivity between about 1-25%, or between 1-5% or between 5-15%, and wherein the first reflective element is adapted to substantially cause the corresponding remaining fraction of the light that reaches the first reflective element to be transmitted as an output beam.

12. A laser system according to claim 1, wherein the first feedback device is positioned in the path of a first lobe of the redirected combined intensity distribution, and wherein the second feedback means is positioned in the path of a second lobe of the redirected combined intensity distribution on the opposite side of the principal axis from said first lobe.

13. A laser system according to claim 1, wherein the second feedback device is adapted to selectively feed back one or more spatial modes of the emitted primary laser beam.

14. A laser system according to claim 13, wherein the one or more spatial modes are one or more spatial modes that are present in the freely running laser.

15. A laser system according to claim 1, wherein the second feedback device comprises a second reflective element and a spatial filter.

16. A laser system according to claim 15, wherein the spatial filter is adapted to prevent at least a central portion of the spatial light distribution proximal to the principle axis from being fed back into the laser assembly.

17. A laser system according to claim 15 or 16, wherein the second reflective element includes a reflective surface area; wherein the spatial filter is formed at least in part by an edge portion of said reflective surface area proximal to the principle axis; and wherein the second reflective element is positioned in the beam path on one side of the principle axis such that the edge portion proximal to the principle axis has a predetermined angular distance from the principle axis.

18. A laser system according to claim 17, wherein the spatial filter is further adapted to block a peripheral beam contribution corresponding to an angular beam contribution above a predetermined upper cut-off angle.

19. A laser system according to claim 1, wherein the second feedback device has a reflectivity larger than 95%.

20. A laser system according to claim 1, wherein the first feedback device comprises an additional spatial filter adapted to block spatial modes of the first redirected beam, which spatial modes correspond to angular contributions having an angle relative to the principle axis smaller than a lower cut-off angle.

* * * * *